United States Patent
Kim et al.

(10) Patent No.: US 8,509,714 B2
(45) Date of Patent: Aug. 13, 2013

(54) BIAS MODULATION APPARATUS, AND APPARATUS AND METHOD FOR TRANSMITTING SIGNAL FOR WIDEBAND MOBILE COMMUNICATION USING THE SAME

(75) Inventors: Joon Hyung Kim, Daejeon (KR); Kwang Chun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 397 days.

(21) Appl. No.: 12/875,670

(22) Filed: Sep. 3, 2010

(65) Prior Publication Data
US 2011/0059707 A1 Mar. 10, 2011

(30) Foreign Application Priority Data

Sep. 4, 2009 (KR) .................... 10-2009-0083672
Sep. 2, 2010 (KR) .................... 10-2010-0086002

(51) Int. Cl.
*H04B 1/04* (2006.01)
(52) U.S. Cl.
USPC .................... 455/127.1; 455/118; 455/550.1; 455/575.1
(58) Field of Classification Search
USPC ....................................... 455/127.1
See application file for complete search history.

(56) References Cited

U.S. PATENT DOCUMENTS

| 5,262,733 | A  | * | 11/1993 | Nakajima et al. ............... 330/10 |
| 7,755,431 | B2 |   | 7/2010  | Sun |
| 2004/0198414 | A1 | * | 10/2004 | Hunton ..................... 455/550.1 |
| 2005/0202790 | A1 | * | 9/2005  | Matsuura et al. ............. 455/118 |
| 2006/0057980 | A1 | * | 3/2006  | Haque et al. ............. 455/127.1 |
| 2007/0291873 | A1 | * | 12/2007 | Saito et al. .................... 375/298 |
| 2008/0158173 | A1 | * | 7/2008  | Hamblin et al. ............. 345/173 |
| 2008/0198944 | A1 | * | 8/2008  | Kim et al. .................... 375/295 |

FOREIGN PATENT DOCUMENTS

| KR | 10-2008-0076165 A | 8/2008 |
| KR | 10-2009-0069143 A | 6/2009 |

* cited by examiner

*Primary Examiner* — Ajibola Akinyemi
(74) *Attorney, Agent, or Firm* — Kile Park Reed & Houtteman PLLC

(57) ABSTRACT

In a wideband mobile communication system, a signal transmitting apparatus separates an envelope curve signal which is size information and a phase signal which is phase information from a signal to transmit, and compares the envelope curve signal with a predetermined voltage. The signal transmitting apparatus performs active bias control that amplifies and outputs an envelope curve signal according to different driving voltages based on a comparison result, and supplies a bias voltage to a power amplifier that amplifies a phase signal based on the amplified signal.

10 Claims, 5 Drawing Sheets

… (US 8,509,714 B2)

BIAS MODULATION APPARATUS, AND APPARATUS AND METHOD FOR TRANSMITTING SIGNAL FOR WIDEBAND MOBILE COMMUNICATION USING THE SAME

CROSS-REFERENCE TO RELATED APPLICATION

This application claims priority to and the benefit of Korean Patent Application Nos. 10-2009-0083672 and 10-2010-0086002 filed in the Korean Intellectual Property Office on Sep. 4, 2009 and Sep. 2, 2010, the entire contents of which are incorporated herein by reference.

BACKGROUND OF THE INVENTION (a) Field of the Invention

The present invention relates to a signal transmitting apparatus. More particularly, the present invention relates to a bias modulation apparatus and an apparatus and method for transmitting a wideband mobile communication signal using the same.

(b) Description of the Related Art

At present, mobile communication systems have been developed from an existing code division multiple access (CDMA) system to a system having a multi-carrier modulation method such as orthogonal frequency division multiplexing (OFDM) for a high data transmission speed. For example, WIMAX, WIBro, and 3G long term evolution (LTE) systems select an OFDM modulation method. The OFDM system has a drawback that a peak to average power ratio (PAPR) of a transmission signal is high by the summation of carriers.

The most important characteristics in a transmitting apparatus of a mobile communication system are linearity and efficiency, but linearity and efficiency are in a trade-off relationship and thus it is difficult to satisfy both.

Currently, a method that has been discussed in order to increase efficiency while satisfying both characteristics may include an envelope elimination and restoration method (EER) of inputting a phase signal to a switching power amplifier using a polar coordinate and applying envelope curve information to a bias modulation unit of a power amplifier, and an envelope tracking method (ET) of modulating bias of a power amplifier while applying a general complex in-phase/quadrature (I/Q) signal, which is not a phase signal, as an input signal of the power amplifier.

In the EER method, because a signal in which an envelope curve is removed becomes the input of a power amplifier, amplification efficiency is maximized, but there is a drawback that the power amplifier should be matched to a wideband due to a band extension problem of the input phase signal. Further, because the EER method is very sensitive to a time error between an envelope curve information signal and a phase output signal, it is very difficult to form hardware.

In order to compensate for this, amplification efficiency is theoretically reduced a little but an up-conversion signal of a complex I/Q signal is used as an input signal, and a structure using an ET method that modulates bias of a power amplifier according to a size of an input signal has been in the spotlight.

Because both the EER method and the ET method should modulate bias to correspond to an envelope curve signal, overall transmission efficiency is represented by multiplication of efficiency of a bias modulation unit and overall efficiency of a power amplifier.

$$\eta = \eta_{bias\ modulation\ unit} \times \eta_{power\ amplifier} \quad [\text{Equation 1}]$$

Here, $\eta$ represents transmission efficiency of a system, $\eta_{bias\ modulation\ unit}$ represents efficiency of the bias modulation unit, and $\eta_{power\ amplifier}$ represents efficiency of a power amplifier.

Therefore, in a power amplifier of a structure using an EER or ET method, efficiency of the bias modulation unit becomes an important parameter that determines efficiency of an entire system, and a method of maximizing the efficiency is necessary.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a bias modulation apparatus having high efficiency and an apparatus and method for transmitting a signal having advantages of improving transmission efficiency using the same.

An exemplary embodiment of the present invention provides a signal transmitting apparatus including: a polar coordinate converter that separates and outputs an envelope curve signal which is size information and a phase signal which is phase information from a signal to be transmitted; an up-converter that up-converts and outputs the phase signal; a bias modulation unit that compares the envelope curve signal with a predetermined voltage and that amplifies and outputs the envelope curve signal according to different driving voltages based on a comparison result; and a power amplifier that amplifies and outputs the phase signal output from the up-converter using a signal that is output from the bias modulation unit as a bias voltage.

Another embodiment of the present invention provides a method of amplifying and transmitting a signal to be transmitted by a transmitting apparatus in a mobile communication system, the method including: separating and outputting, by the transmitting apparatus, an envelope curve signal which is size information and a phase signal which is phase information from a signal to transmit; up-converting and outputting, by the transmitting apparatus, the phase signal; comparing, by the transmitting apparatus, the envelope curve signal with a predetermined voltage and amplifying and outputting the envelope curve signal according to different driving voltages based on a comparison result; amplifying and outputting, by the transmitting apparatus, the up-converted phase signal according to a bias voltage based on the amplified and output envelope curve signal; and transmitting the amplified and output signal.

Yet another embodiment of the present invention provides a bias modulation apparatus that supplies a bias voltage to a signal transmitting apparatus that amplifies a phase signal, which is phase information of a signal to transmit, the bias modulation apparatus including: a first comparator that compares an envelope curve signal which is size information of a signal to transmit and a predetermined voltage, and that outputs a signal corresponding to a comparison result; an amplification controller that outputs a driving voltage having different values according to a signal that is output from the first comparator; an amplifier that amplifies and outputs the envelope curve signal according to a driving voltage that is output from the amplification controller; and a buck converter that supplies a bias voltage for restoring a signal to transmit to the signal transmitting apparatus by operating based on the amplified envelope curve signal that is output from the amplifier.

DETAILED DESCRIPTION OF THE EMBODIMENTS

Figure 1:
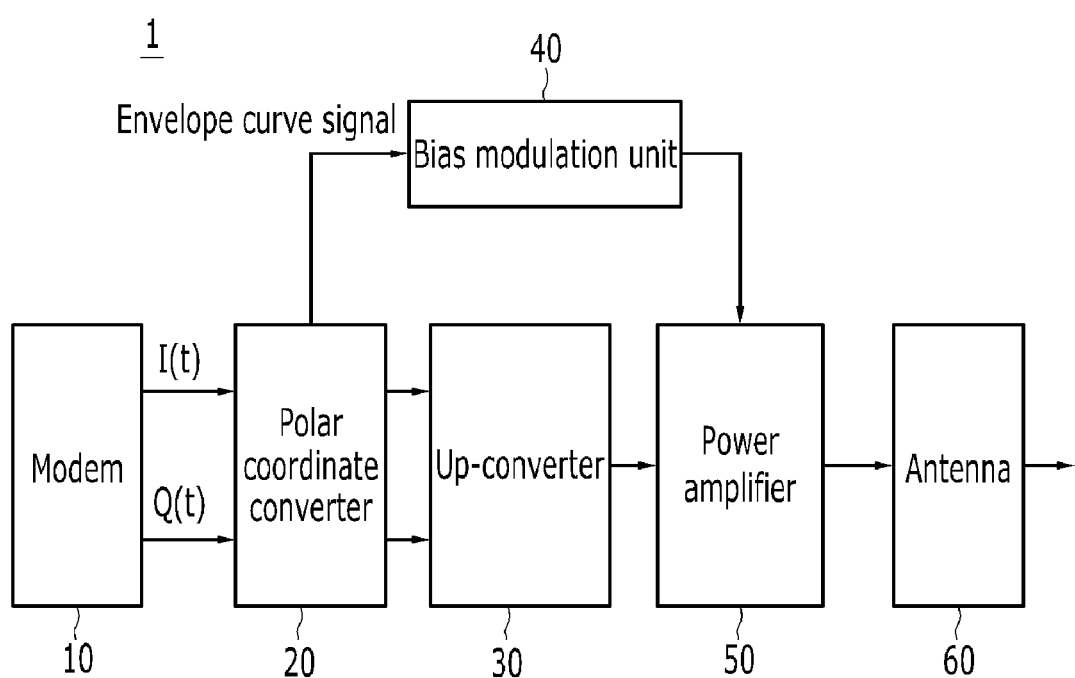
FIG. 1 is a block diagram illustrating a configuration of a signal transmitting apparatus according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, in the entire specification, unless explicitly described to the contrary, the word "comprise" and variations such as "comprises" or "comprising" will be understood to imply the inclusion of stated elements but not the exclusion of any other elements. Further, when it is described that an element is "coupled" to another element, the element may be "directly coupled" to the other element or "indirectly coupled" to the other element through a third element.

Hereinafter, a bias modulator and a signal transmitting apparatus using the same according to an exemplary embodiment of the present invention will be described with reference to the drawings.

FIG. 1 is a block diagram illustrating a configuration of a signal transmitting apparatus according to an exemplary embodiment of the present invention.

As shown in FIG. 1, a signal transmitting apparatus 1 according to an exemplary embodiment of the present invention includes a modem 10, a polar coordinate converter 20, an up-converter 30, a bias modulation unit 40, a power amplifier 50, and an antenna 60.

The modem 10 receives transmission data and information that is related to resource allocation from an upper level hierarchy, forms a physical channel using the resource allocation information, modulates the transmission data to a complex digital signal to correspond to the physical channel, and outputs the complex digital signal. The modulated complex digital signal includes an in-phase (I) signal I(t) and a quadrature (Q) signal Q(t).

The polar coordinate converter 20 separates an input complex digital signal into an envelope curve signal which is size information and a phase signal which is phase information, and outputs the envelope curve signal and the phase signal.

Specifically, the polar coordinate converter 20 takes a square root of an I signal and a Q signal, which are complex digital signals, and calculates respective size values thereof, and adjusts and outputs the size of the I signal and the Q signal by a gain adjustment value according to the calculated size values. In this way, an I signal and a Q signal having an adjusted size value are referred to as an envelope curve signal, which is size information. Further, the polar coordinate converter 20 outputs a phase signal having a cosine (cos) value and a sine (sin) value for a phase from the I signal and the Q signal, which are the input complex digital signals.

The up-converter 30 receives, up-converts, and outputs a phase signal that is output from the polar coordinate converter 20. That is, the up-converter 30 converts and outputs a phase signal of a baseband to an RF signal. The up-converted and output phase signal is input to the power amplifier 50 in a form having an envelope curve.

An envelope curve signal that is output from the polar coordinate converter 20 is input to the bias modulation unit 40, and the bias modulation unit 40 amplifies and modulates the input envelope curve signal and outputs the signal to the power amplifier 50.

The power amplifier 50 amplifies and outputs an up-converted phase signal that is output from the up-converter 30, and specifically, the power amplifier 50 amplifies and outputs an up-converted phase signal that is input from the up-converter 30 while using a signal that is output from the bias modulation unit 40 as an output bias voltage. In this case, because an up-converted phase signal, i.e., an RF signal, that is input from the up-converter 30 is formed with a phase component that does not have a size component, the power amplifier 50 amplifies and outputs an RF signal without distortion and restores a size component of a signal to transmit using an envelope curve signal that is output from the bias modulation unit 40 as a bias voltage.

In this way, a signal that is output from the power amplifier 50 is transmitted through the antenna 60. A duplexer, filter, etc. can be additionally formed between the power amplifier 50 and the antenna 60, and this can be formed by a person of ordinary skill in the art and therefore a detailed description thereof will be omitted.

In the signal transmitting apparatus 1 that is formed in such a structure, the bias modulation unit 40 generally converts an envelope curve signal to an analog signal, amplifies the converted signal according to a value necessary for the power amplifier 50, lowers a voltage of the amplified signal, and provides the voltage to the power amplifier 50.

In a wideband mobile communication system and an orthogonal frequency division multiplexing (OFDM) system in which a peak to average power ratio (PAPR) is about 10 dB, efficiency of the bias modulation unit 40 is generally low as about 68%. When efficiency of the bias modulation unit 40 is low, efficiency of an entire system is also deteriorated and thus in an exemplary embodiment of the present invention, in order to improve efficiency of the bias modulation unit 40, the bias modulation unit 40 dynamically operates according to a size of an envelope curve signal of a signal to transmit.

Figure 2:
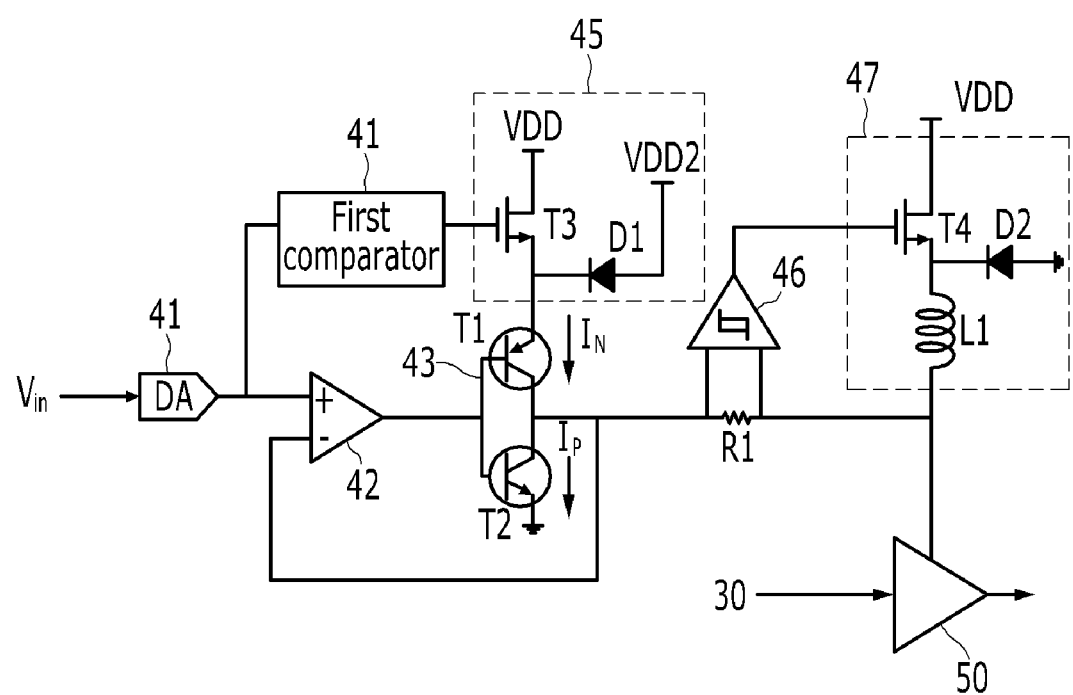
FIG. 2 is a diagram illustrating a detailed configuration of a bias modulation unit of a signal transmitting apparatus according to an exemplary embodiment of the present invention.

FIG. 2 is a diagram illustrating a detailed configuration of a bias modulation unit according to an exemplary embodiment of the present invention.

As shown in FIG. 2, the bias modulation unit 40 according to an exemplary embodiment of the present invention includes a signal converter 41, a first amplifier 42, a second amplifier 43, a first comparator 44, an amplification controller 45, a second comparator 46, and a buck converter 47.

The signal converter 41 converts and outputs the input digital signal to an analog signal, and specifically, the signal converter 41 receives a digital form of envelope curve signal that is output from the polar coordinate converter 20 to convert and output to an analog signal.

The first amplifier 42 receives, amplifies, and outputs an analog form of envelope curve signal that is output from the signal converter 41, and is formed with a negative feedback form of OP amplifier that receives an envelope curve signal through a non-inversion terminal (+) and that receives a signal that is fed back through an inversion terminal (−).

The second amplifier 43 amplifies and outputs a signal that is output from the first amplifier 42, and particularly, the second amplifier 43 is a class AB amplifier that amplifies and outputs a signal that is driven and input according to a first amplification driving voltage VDD or a second amplification driving voltage VDD2 that is provided from the amplification controller 45. The second amplifier 43, which is a class AB amplifier, includes a transistor T1 and a transistor T2 having a gate terminal that is connected to an output terminal of the first amplifier 42. The transistor T1 is a PNP type of transistor having an emitter terminal that is connected to an output terminal of the amplification controller 45. A collector terminal of the transistor T2 is connected to a collector terminal of the transistor T1, and the transistor T2 is an NPN type transistor having a grounded emitter terminal. An amplified signal is output through a contact point between a collector terminal of the transistor T1 and a collector terminal of the transistor T2, and this signal is fed back to the first amplifier 42 while being provided to the power amplifier 50.

The first comparator 44 compares an analog form of envelope curve signal that is output from the signal converter 41 with a predetermined voltage, and outputs the envelope curve signal. The amplification controller 45 operates according to a signal that is output from the first comparator 44 to output a first amplification driving voltage or a second amplification driving voltage. For this purpose, the amplification controller 45 includes a diode D1 and a transistor T3 operating according to a signal that is output from the first comparator 44.

The transistor T3 operates according to an output signal of the first comparator 44 that is input to a gate terminal to output a VDD voltage that is input to a drain terminal as a first amplification driving voltage. When the transistor T3 does not operate, the diode D1 outputs a VDD2 voltage that is input to an anode terminal as a second amplification driving voltage. Here, the VDD voltage is larger than the VDD2 voltage.

Therefore, when the transistor T3 is turned on according to an output signal of the first comparator 44, a VDD voltage is output through the transistor T3 and thus a voltage that is applied to a cathode terminal of the diode D1 is larger than a voltage that is applied to an anode terminal, whereby the diode D1 does not operate. Accordingly, a VDD voltage that is output through the transistor T3 is output as the first amplification driving voltage. When the transistor T3 is turned off according to an output signal of the first comparator 44, a voltage is not applied to a cathode terminal of the diode D1 and thus a VDD2 voltage that is input to the anode terminal is output as the second amplification driving voltage through the diode D1.

In this way, according to an exemplary embodiment of the present invention, the output of the second amplifier 43, which is a class AB amplifier, sustains waveform information of an envelope curve signal. Specifically, because a general probability distribution of an envelope curve signal has a Rayleigh distribution, when an average value of an envelope curve signal is backed off, for example, about 10 dB, a peak value is not often distributed in view of probability. Therefore, in order to drive a class AB amplifier (second amplifier), it is unnecessary to fix an input voltage to VDD. Therefore, in an exemplary embodiment of the present invention, an active bias control is performed in which the second amplifier 43 drives in VDD (a first amplification driving voltage) when an envelope curve signal has a larger value than a predetermined voltage and in which the second amplifier 43 drives in VDD2 (a second amplification driving voltage) that is lower than VDD when an envelope curve signal has a value smaller than a predetermined voltage, thereby increasing efficiency of the second amplifier 43.

The second comparator 46 compares a signal that is output from the second amplifier 43 and a signal that is output from the buck converter 47. Specifically, the second comparator 46 compares an output signal of the second amplifier 43 that is input through an input terminal and an output signal of the buck converter 47 that is input through another input terminal, and outputs a signal according to a comparison result to the buck converter 47. A resistor R1 is installed between two input terminals of the second comparator 46. Here, the resistor R1 may supply a current necessary for the power amplifier 50, and functions as an element that determines a direction of a current that is output from the second amplifier 43 by removing an unnecessary harmonic component. The resistor R1 has a value of, for example, about 0.1-1Ω.

The buck converter 47 operates according to a signal that is output from the second comparator 46 to supply a bias voltage for restoring a signal to transmit to the power amplifier 50. For this purpose, the buck converter 47 includes a transistor T4 having a gate terminal that is connected to an output terminal of the second comparator 46 and to which a VDD voltage is applied to a drain terminal, an inductor L1 having one terminal that is connected to an emitter terminal of the transistor M2 and the other terminal that is connected to a bias input terminal of the power amplifier 50 and that integrates a current that is output through the transistor T4, and a diode D2 having a cathode terminal that is connected to an emitter terminal of the transistor T4. One terminal of the resistor R1 of the second comparator 46 and the other terminal of the inductor L1 are connected to each other, and two contact points are connected to the bias input terminal of the power amplifier 50.

The buck converter 47 of such a structure operates according to a comparison result signal that is output from the second comparator 46. For example, a voltage VDD is applied to the drain terminal according to a high level of comparison signal, and a current according to the applied voltage VDD is output through a source terminal of the transistor T4. A signal that is output from the transistor T4 removes a high frequency component while passing through the inductor L1. An output signal in which a high frequency component is removed is applied to a bias voltage of the power amplifier 50. Thereafter, when the transistor T4 is turned off according to a comparison signal of a low level, energy that has been stored in the inductor L1 operates like an input power source while being discharged, and thus a current is supplied to a load i.e., the power amplifier 50. That is, the power amplifier 50 operates using a current that is selectively provided according to a slope of an envelope curve signal as a DC power source.

A voltage that is output from the buck converter 47 changes according to an on-state time period of a signal according to a comparison of a signal that is output from the second amplifier 43 and a signal that is output from the buck converter 47, and resultantly, the buck converter 47 lowers a voltage of a VDD level to a voltage corresponding to a voltage that is amplified and output from the second amplifier 43 and supplies the voltage as a bias voltage to the power amplifier 50.

In a signal transmitting apparatus that is formed in such a structure according to an exemplary embodiment of the present invention, a transistor and a diode are referred to as a switching element, and various kinds of transistors can be used according to a request of each unit.

Next, a method of transmitting a signal according to an exemplary embodiment of the present invention will be described based on such a structure.

Figure 3:
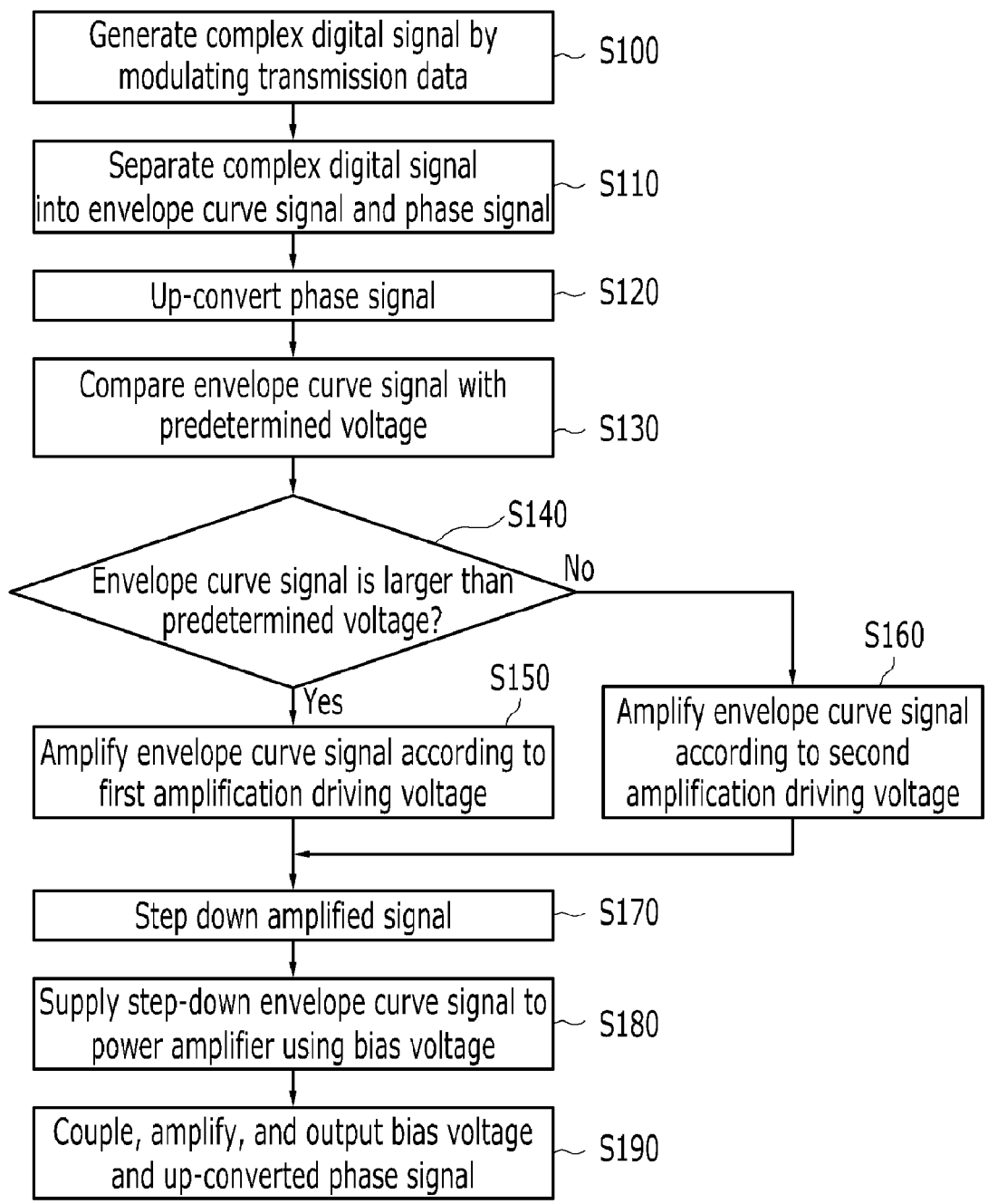
FIG. 3 is a flowchart illustrating a method of transmitting a signal according to an exemplary embodiment of the present invention.

FIG. 3 is a flowchart illustrating a method of transmitting a signal according to an exemplary embodiment of the present invention.

As shown in FIG. 3, the modem 10 receives transmission data from an upper level hierarchy, modulates the transmission data into a complex digital signal, and outputs the complex digital signal (S100). The polar coordinate converter 20 separates the input complex digital signal into an envelope curve signal which is size information and a phase signal which is phase information, and outputs the envelope curve signal and the phase signal (S110). The phase signal is up-converted to an RF signal through the up-converter 30 to be input to the power amplifier 50 (S120), and the envelope curve signal is input to the bias modulation unit 40.

The bias modulation unit 40 compares the input envelope curve signal with a predetermined voltage (S130), and if the envelope curve signal is larger than a predetermined voltage, the bias modulation unit 40 allows the first amplification driving voltage to be supplied to the second power amplifier 43 by operating the amplification controller 45. Specifically, if the envelope curve signal is larger than a predetermined voltage, the bias modulation unit 40 outputs a high level comparison signal and the transistor T3 of the amplification controller 45 is turned on according to the high level comparison signal, and thus the first amplification driving voltage VDD is provided to the second amplifier 43. Accordingly, the second amplifier 43 is converted to an analog signal by the signal converter 41 and is amplified and output according to the first amplification driving voltage VDD that applies an envelope curve signal that is amplified and output by the first amplifier 42 (S140).

If the envelope curve signal is smaller than a predetermined voltage, the bias modulation unit 40 operates the amplification controller 45 so that the first amplification driving voltage may be supplied to the second power amplifier 43. Specifically, if the envelope curve signal is larger than a predetermined voltage, the bias modulation unit 40 outputs a low level comparison signal, the transistor T3 of the amplification controller 45 is turned off according to the low level comparison signal, and the second amplification driving voltage VDD2 is provided to the second amplifier 43 through the diode D1. Accordingly, the second amplifier 43 amplifies and outputs an envelope curve signal that is converted to an analog signal by the signal converter 41 and that is amplified and output by the first amplifier 42 according to the applied second amplification driving voltage VDD2. Here, the first amplification driving voltage VDD is larger than the second amplification driving voltage VDD2. According to such an active bias control, the second amplifier 43, which is a class AB amplifier, operates according to a high voltage for a high input signal and dynamically operates according to a relatively low voltage for a low input signal (S160).

A signal that is dynamically amplified and output by the second amplifier 43 is provided to the second comparator 46 and the buck converter 47 according to a size value of an envelope curve signal. A voltage that is input while the buck converter 47 is driven according to a comparison result of an output signal of the second amplifier 43 that is performed in the second comparator 46, and an output signal of the buck converter 47 is lowered to a voltage corresponding to an output signal of the second amplifier 43 and is supplied as a bias voltage of the power amplifier 50 (S170 and S180).

Thereafter, the power amplifier 50 amplifies and outputs an up-converted phase signal that is output from the up-converter 30 while using a signal that is output from the bias modulation unit 40 as a bias voltage (S190). Signals that are output from the power amplifier 50 are radiated through the antenna 60 after passing through a duplexer and a filter that are not shown.

Figure 4:
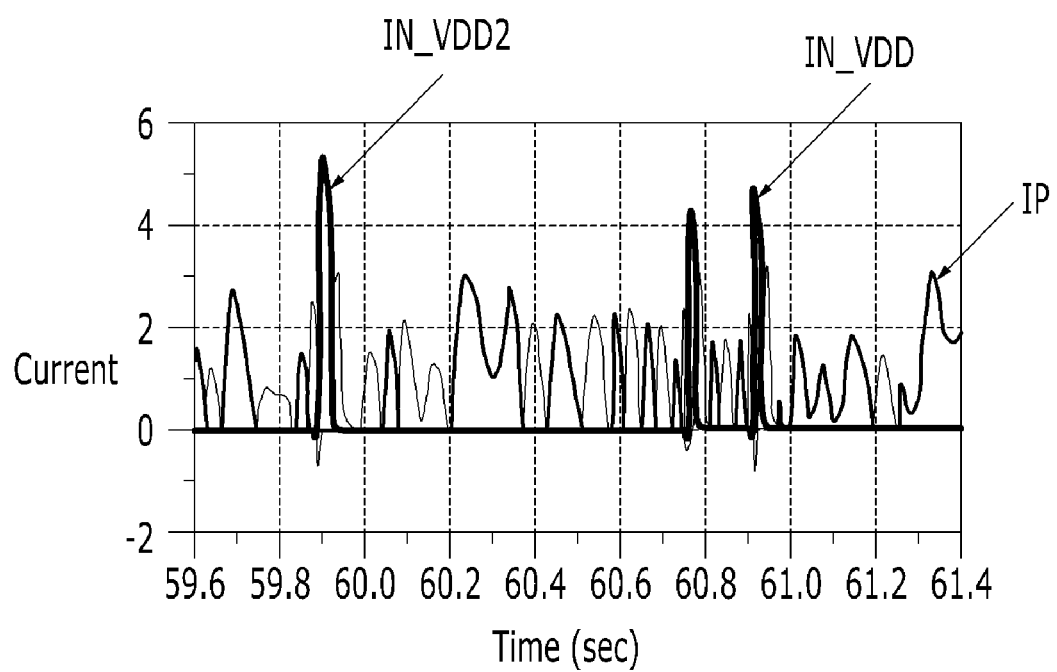
FIG. 4 is a graph illustrating an output current of a second power amplifier of a bias modulation unit according to an exemplary embodiment of the present invention.

In the signal transmitting apparatus 1 according to an exemplary embodiment of the present invention operating as described above, output current characteristics of the second amplifier 43, which is a class AB amplifier, of the bias modulation unit 40 are shown in FIG. 4.

FIG. 4 is a graph illustrating output current characteristics of a second amplifier of a bias modulation unit according to an exemplary embodiment of the present invention.

If the maximum size of an envelope curve signal, which is size information of a signal to transmit, for example, is a VDD level, only when both a voltage and a current according to an envelope curve signal are supplied to the power amplifier 50 does the power amplifier 50 couple a phase signal of a signal to transmit to an envelope curve signal and amplify the coupled signal, thereby normally transmitting a signal to originally transmit. In an exemplary embodiment of the present invention, most of a current that is supplied to the power amplifier 50 is provided from the buck converter 47, and the remaining current is provided from the second amplifier 43. A current that is supplied from the buck converter 47 is a DC current and a low frequency current, and the second amplifier 43 performs a function of sinking a current in order to remove switching noise generating in the buck converter 47. That is, a current that is supplied from the second amplifier 43 to the power amplifier 50 is "$I_N$", as shown in FIG. 2, and an unnecessary current and a removed harmonic current become "$I_P$". It is unnecessary for an amplified driving voltage, which a voltage that is input to a second power amplifier in order to drive the second amplifier 43, to be fixed to a VDD value, which is the highest level. Therefore, in an exemplary embodiment of the present invention, an amplification driving voltage for driving the second amplifier 43 becomes a lower voltage than the VDD or the VDD, which is the highest level according to a size of an envelope curve signal, thereby increasing efficiency of the second amplifier 43.

Because a VDD or a VDD2 is supplied as an amplification driving voltage according to the size of an envelope curve signal, a current IN according to a voltage that is output through the second amplifier 43 becomes IN_VDD and IN_VDD2, as shown in FIG. 4. The entire consumption DC power amount of the second amplifier is represented by VDD×(mean(IN_VDD))+VDD2×(mean(IN_VDD2)), and the power consumption amount of the second power amplifier is smaller than the power consumption amount generating when using a class AB amplifier that is driven according to a conventionally fixed voltage. Therefore, it can be seen that efficiency of the second power amplifier increases.

Figure 5:
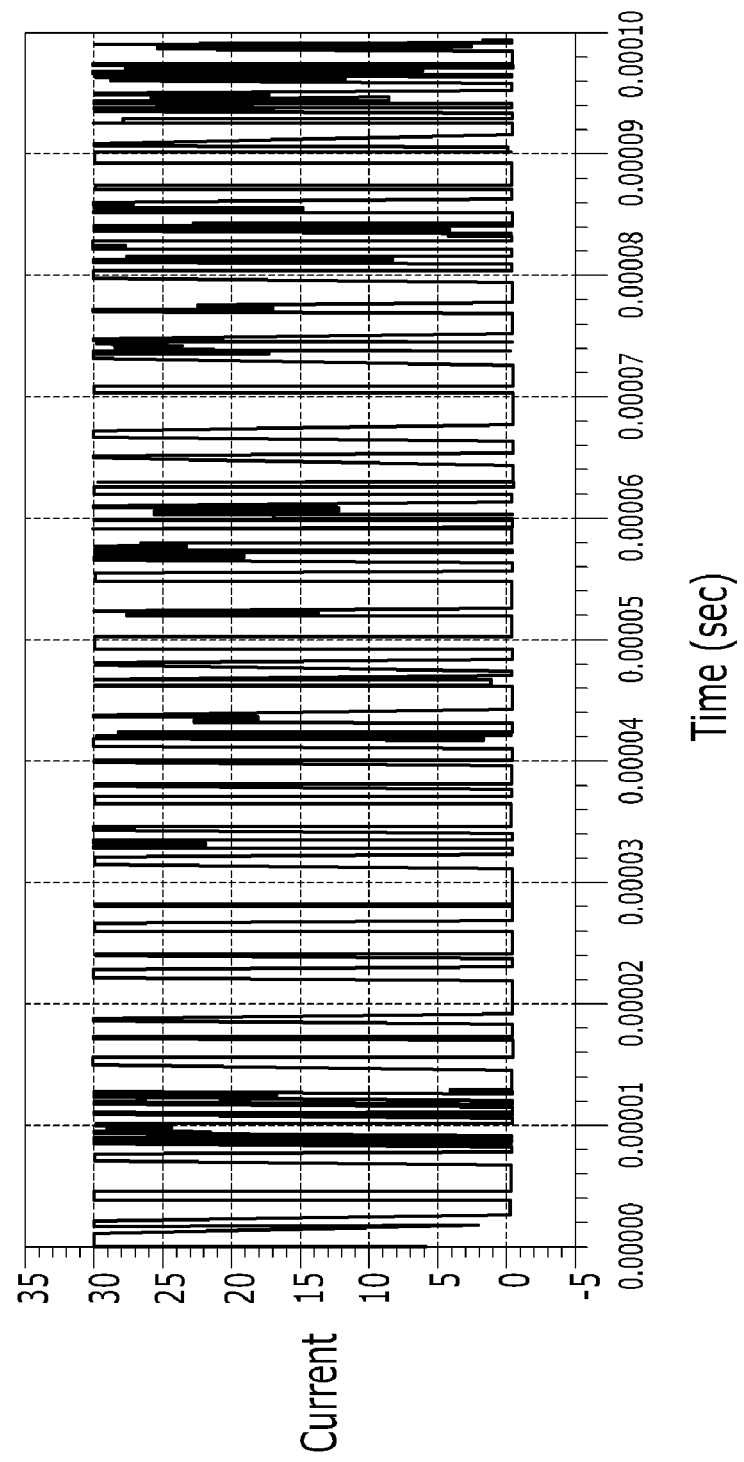
FIG. 5 is a graph illustrating an output waveform of a buck converter of a bias modulation unit according to an exemplary embodiment of the present invention.

Further, an output waveform of a buck converter according to an exemplary embodiment of the present invention is shown in FIG. 5. FIG. 5 is a graph illustrating an output waveform of a buck converter according to an exemplary embodiment of the present invention.

While the buck converter 47 according to an exemplary embodiment of the present invention is driven according to a comparison result of an output voltage value of the second amplifier 43, which is a class AB amplifier, and an output voltage value of the buck converter 47, the buck converter 47 outputs a voltage that is shown in FIG. 5. The voltage that is shown in FIG. 5 is applied as a bias voltage to the power amplifier 50.

According to an exemplary embodiment of the present invention, by increasing efficiency of a class AB amplifier, efficiency of the bias modulation unit can be finally increased. As efficiency of the bias modulation unit increases, transmission efficiency of an entire system resultantly increases, as represented by Equation 1.

Further, as described above, by a dynamic bias modulation method, absolute efficiency of the bias modulation unit can increase about 10%, and a wideband hardware configuration of an EER/ET that is difficult to form due to a problem of the bias modulation unit having low efficiency can be easily formed.

Further, in an exemplary embodiment of the present invention, while most current according to an envelope curve signal is supplied to the current amplifier through a buck converter, a current according to an envelope curve signal is supplied from a class AB stage of the second amplifier to the power amplifier and thus both a current and a voltage of an envelope curve signal are supplied to the current amplifier and coupling amplification of a phase signal and an envelope curve signal is performed, whereby a signal to transmit can be more accurately and effectively transmitted.

The foregoing exemplary embodiment of the present invention may be not only embodied through an apparatus and method but also embodied through a program that can execute a function corresponding to a configuration of a method of transmitting a signal according to the exemplary embodiment of the present invention, or through a computer readable recording medium on which the program is recorded and can be easily embodied by a person of ordinary skill in the art from a description of the foregoing exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A signal transmitting apparatus comprising:
    a polar coordinate converter that separates and outputs an envelope curve signal which is size information and a phase signal which is phase information from a signal to be transmitted;
    an up-converter in communication with the polar coordinate converter that up-converts and outputs the phase signal received form the polar coordinate converter;
    a power amplifier in communication with the up-converter that amplifies and outputs the phase signal output from the up-converter; and
    a bias modulation unit in communication with the polar coordinate converter and the power amplifier, the bias modulation unit comprising:
        a first comparator in communication with the polar coordinate converter to compare an analog form of the envelope curve signal received from the polar coordinate converter with a predetermined voltage; and
        a second comparator in communication with the first comparator and the power amplifier, the bias modulation unit configured to amplify and output the envelope curve signal according to different driving voltages based on a comparison result;
    wherein the power amplifier amplifies the phase signal output using the envelope curve signal output from the bias modulation unit as a bias voltage,
    wherein if the analog form of the envelope curve signal is larger than the predetermined voltage, the bias modulation unit amplifies the envelope curve signal according to a first driving voltage, and if the analog form of the envelope curve signal is smaller than the predetermined voltage, the bias modulation unit amplifies the envelope curve signal according to a second driving voltage, the first driving voltage larger than the second driving voltage.

2. The signal transmitting apparatus of claim 1, wherein the bias modulation unit further comprises:
    a first amplifier in communication with the polar coordinate converter to receive the analog form of the envelop curve signal through a non-inversion terminal; and
    a second amplifier comprising a first transistor and a second transistor, wherein gate terminals of the first and second transistors are in communication with a first amplifier output, collector terminals of the first and second transistors are in communication with an inversion terminal of the first amplifier and the second comparator and an emitter terminal of the first transistor is in communication with the first comparator, wherein the second amplifier amplifies and outputs the envelope curve signal according to the first amplification driving voltage or the second amplification driving voltage.

3. The signal transmitting apparatus of claim 2, wherein the second amplifier comprises a class AB amplifier.

4. The signal transmitting apparatus of claim 2, wherein the bias modulation unit further comprises a buck converter comprising:
    a fourth transistor comprising a drain terminal in communication with the first amplification driving voltage, a gate terminal in communication with an output from the second comparator, and an emitter terminal in communication with an input to the second comparator and the power amplifier;
    wherein the second comparator compares a signal output from the second amplifier and a signal that is output from the buck converter and drives the buck converter according to a comparison result, and the buck converter supplies a bias voltage for restoring a signal to transmit to the power amplifier.

5. The signal transmitting apparatus of claim 2, wherein the bias modulation unit further comprises an amplification controller comprising:
    a third transistor comprising:
        a gate terminal in communication with the first comparator;
        a drain terminal in communication with first amplification driving voltage; and
        a emitter terminal in communication with the first transistor emitter terminal; and
    a diode comprising:
        a cathode terminal in communication with the third transistor emitter terminal; and
        an anode terminal in communication with the second amplification driving voltage;
    wherein the amplification controller outputs a first amplification driving voltage or a second amplification driving voltage according to a signal that is output from the first comparator.

6. A method of amplifying and transmitting a signal to be transmitted by a transmitting apparatus in a mobile communication system, the method comprising: separating and outputting, by the transmitting apparatus, an envelope curve signal which is size information and a phase signal which is phase information from a signal to transmit; up-converting and outputting, by the transmitting apparatus, the phase signal; using a first comparator to compare an analog form of the envelope curve signal with a predetermined voltage; using a second comparator to compare the envelope curve signal amplified by an amplifier according to different driving voltages based on the first comparator comparison result and a signal that is output from a buck converter to drive the buck converter in accordance with the second comparator comparison; amplifying and outputting, by the transmitting apparatus, the up-converted phase signal according to a bias voltage supplied by the buck converter based on the amplified and output envelope curve signal; and transmitting the amplified and output signal, wherein the amplifying and outputting of the envelope curve signal comprises: amplifying, by the amplifier in the bias modulation unit, if the analog form of the envelope curve signal is larger than the predetermined voltage, the envelope curve signal according to a first driving voltage; and amplifying, by the amplifier in the bias modulation unit, if the analog form of the envelope curve signal is smaller than the predetermined voltage, the envelope curve signal according to a second driving voltage, wherein the first driving voltage is larger than the second driving voltage.

7. The method of claim 6, wherein the amplifying and outputting of the up-converted phase signal comprises:

comparing an envelope curve signal that is amplified and output according to the first driving voltage or the second driving voltage and the bias voltage, and sustaining and outputting the bias voltage to a size corresponding to the envelope curve signal according to a comparison result; and amplifying and outputting the up-converted phase signal according to the bias voltage.

8. A bias modulation apparatus that supplies a bias voltage to a signal transmitting apparatus that amplifies a phase signal, which is phase information of a signal to transmit, the bias modulation apparatus comprising:

a first comparator that compares an envelope curve signal which is size information of a signal to transmit and a predetermined voltage, and that outputs a signal corresponding to a comparison result;

an amplification controller in communication with the first comparator and a plurality of driving voltages, each driving voltage having a different value, the amplification controller outputting a given driving voltage from the plurality of driving voltages according to a signal output from the first comparator;

an amplifier in communication with the amplification controller, the amplifier amplifies and outputs the envelope curve signal according to the given driving voltage output from the amplification controller; and a buck converter in communication with the amplifier, the buck converter supplies a bias voltage for restoring a signal to transmit to the signal transmitting apparatus by operating based on the amplified envelope curve signal that is output from the amplifier, wherein the bias modulation apparatus further comprises a second comparator in communication with the amplifier and the buck converter, the second comparator compares a signal that is output from the amplifier and a signal that is output from the buck converter, and drives the buck converter according to the comparison result.

9. The bias modulation apparatus of claim 8, wherein the amplification controller comprises:

a first switching element in communication with an output from the first comparator, the amplifier and a first driving voltage, the first switching element supplies, if an output from the first comparator indicates that the envelope curve signal is larger than the predetermined voltage, a first driving voltage to the amplifier by operating in accordance with the first comparator output; and a second switching element in communication with the first switching element, the amplifier and a second driving voltage, the second switching element supplies, if the first comparator output indicate that the envelope curve signal is smaller than the predetermined voltage, a second driving voltage to the amplifier by operating in accordance with the first comparator output, wherein the first driving voltage is larger than the second driving voltage.

10. The bias modulation apparatus of claim 8, further comprising:

a signal converter in communication with the first comparator, the signal converter converts and outputs an analog form of the envelope curve signal that is output from a polar coordinate converter that is on communication with the signal converter; and an analog envelope curve signal amplifier in communication with the signal converter and the amplifier, the analog envelope curve amplifier amplifies output from the signal converter and outputs the amplified analog envelope curve signal to the amplifier.

* * * * *